United States Patent
Leobandung

(10) Patent No.: US 9,536,739 B2
(45) Date of Patent: Jan. 3, 2017

(54) SELF-CUT SIDEWALL IMAGE TRANSFER PROCESS

(71) Applicant: International Business Machines Corporation, Armonk, NY (US)

(72) Inventor: Effendi Leobandung, Stormville, NY (US)

(73) Assignee: International Business Machines Corporation, Armonk, NY (US)

(*) Notice: Subject to any disclaimer, the term of this patent is extended or adjusted under 35 U.S.C. 154(b) by 16 days.

(21) Appl. No.: 14/525,484

(22) Filed: Oct. 28, 2014

(65) Prior Publication Data

US 2016/0118263 A1    Apr. 28, 2016

(51) Int. Cl.

| | |
|---|---|
| *H01L 21/311* | (2006.01) |
| *H01L 21/76* | (2006.01) |
| *H01L 21/033* | (2006.01) |
| *H01L 29/78* | (2006.01) |
| *H01L 21/8234* | (2006.01) |
| *H01L 21/308* | (2006.01) |
| *G06F 17/50* | (2006.01) |
| *H01L 21/3213* | (2006.01) |

(52) U.S. Cl.
CPC ....... *H01L 21/0337* (2013.01); *G06F 17/5045* (2013.01); *H01L 21/0338* (2013.01); *H01L 21/3086* (2013.01); *H01L 21/31144* (2013.01); *H01L 21/32139* (2013.01); *H01L 21/823431* (2013.01); *H01L 29/785* (2013.01)

(58) Field of Classification Search
CPC ............. H01L 21/3088; H01L 21/3086; H01L 21/31111; H01L 21/31051; H01L 21/823431;H01L 29/785; H01L 21/0337; H01L 21/0338; H01L 21/32139; H01L 21/845; H01L 21/31144; H01L 21/308; H01L 21/3083
USPC .......................... 438/703, 696, 694, 702, 427
See application file for complete search history.

(56) References Cited

U.S. PATENT DOCUMENTS

| | | | |
|---|---|---|---|
| 7,265,013 B2 | 9/2007 | Furukawa et al. | |
| 7,687,339 B1 | 3/2010 | Schultz et al. | |
| 7,763,531 B2 | 7/2010 | Abadeer et al. | |
| 8,455,364 B2 | 6/2013 | Kanakasabapathy | |
| 8,637,363 B1 * | 1/2014 | Jung ................... | H01L 27/0207 257/E21.023 |
| 9,209,038 B2 * | 12/2015 | Cantone .............. | H01L 21/3086 |

(Continued)

OTHER PUBLICATIONS

V.S. Basker et al., "A 0.063 μm FinFET SRAM Cell Demonstration with Conventional Lithography Using a Novel Integration Scheme with Aggressively Scaled Fin and Gate Pitch," Symposium on VLSI Technology Digest of Technical Papers, Jun. 2010, pp. 19-20.

(Continued)

*Primary Examiner* — Shouxiang Hu
(74) *Attorney, Agent, or Firm* — Louis J. Percello; Ryan, Mason & Lewis, LLP

(57) ABSTRACT

A plurality of mandrels is formed on a silicon substrate. The mandrels are spaced apart at a given pitch, wherein at least one of the plurality of mandrels is formed having a first width, and at least another one of the plurality of mandrels is formed having a second width, and wherein the first width is greater than the second width. At least one structure is formed by removing at least a portion of the plurality of mandrels in a sidewall image transfer process without using a cut mask.

8 Claims, 6 Drawing Sheets

(56) References Cited

U.S. PATENT DOCUMENTS

| | | | |
|---|---|---|---|
| 2010/0297852 A1* | 11/2010 | Jung | ................... H01L 21/3086 438/745 |
| 2012/0126325 A1 | 5/2012 | Wang et al. | |
| 2012/0235247 A1 | 9/2012 | Cai et al. | |
| 2013/0001749 A1 | 1/2013 | Arnold et al. | |
| 2013/0089984 A1 | 4/2013 | Raghunathan et al. | |
| 2013/0134486 A1 | 5/2013 | LiCausi | |
| 2014/0065802 A1* | 3/2014 | Chang | ................... H01L 21/845 438/479 |
| 2015/0170927 A1* | 6/2015 | Cheng | ................. H01L 27/0886 438/696 |

OTHER PUBLICATIONS

David Lammers, "CMOS Transitions to 22 and 15 nm," Semiconductor International, Jan. 2010, 8 pages.

\* cited by examiner

100

SELF-CUT SIDEWALL IMAGE TRANSFER PROCESS

FIELD

The field is generally related to semiconductor device manufacturing processes.

BACKGROUND

Continued shrinkage of process geometries in complementary metal oxide semiconductor (CMOS) technologies and the like has led to improved manufacturing processes enabling the patterning of devices on integrated circuits. These devices, including for example interconnect lines and transistors (e.g., FinFET), may have geometric features with pitch patterning less than about 40 nanometers (nm). One technique used to achieve such geometric features is known as sidewall image transfer (SIT). In general, the SIT process includes patterning a sacrificial layer (known as a "mandrel") on a silicon structure (e.g., silicon on insulator (SOI)), depositing a mask layer over the mandrel and silicon, etching back the mask layer to form sidewalls, and removing the mandrel and etching the silicon to form features or "fins." The SIT process can achieve twice the pattern density over standard optical lithographic processing techniques by obtaining fins with sub-resolution line-widths, i.e., line-widths less than the critical dimension (CD) of a standard optical lithography process. With the continuous scaling of devices, methods for removing mandrels have proven to be challenging. Typically, a cut mask is used to identify the areas which will be removed by the etching process.

SUMMARY

Embodiments provide an improved semiconductor device manufacturing process. In one embodiment, a method comprises the following steps. A plurality of mandrels is formed on a silicon substrate. The mandrels are spaced apart at a given pitch, wherein at least one of the plurality of mandrels is formed having a first width, and at least another one of the plurality of mandrels is formed having a second width, and wherein the first width is greater than the second width. At least one structure is formed by removing at least a portion of the plurality of mandrels in a sidewall image transfer process without using a cut mask.

DETAILED DESCRIPTION

It is to be appreciated that the invention is not limited to the specific methods illustratively shown and described herein. Rather, embodiments of the invention are directed more broadly to techniques for an improved sidewall image transfer (SIT) process. Moreover, it will become apparent to those skilled in the art given the teachings herein that numerous modifications can be made to the embodiments shown that are within the scope of the present invention. That is, no limitations with respect to the specific embodiments described herein are intended or should be inferred.

As mentioned above, a cut mask is typically used to remove mandrels by identifying the areas which will be removed by the etching process in a conventional SIT process. The cut mask is typically used with larger device geometries, i.e., structures or features having a pitch patterning larger than about 40 nm. However, with devices having pitch patterning of about 40 nm or less, the alignment of the cut mask is very difficult.

Figure 1:
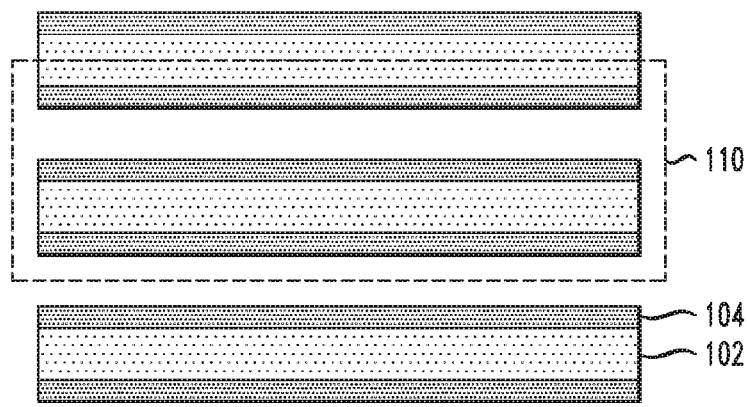
FIG. 1 illustrates a method of removing mandrels in a sidewall image transfer process using a cut mask.

FIG. 1 illustrates a method of removal of a mandrel in a SIT process by utilizing a cut mask. Shown in FIG. 1 is a top view of a semiconductor wafer 100 after formation of mandrels 102 and sidewalls 104 in a SIT process. Cut mask 110 is positioned over these structures to define those regions which will removed by an etching process. However, cutting unwanted/dummy structures (mandrels) becomes very challenging with the continuous scaling to smaller geometric structures on the silicon substrate. The cut mask has to land in the middle between those structures that are to be removed and those structures which will remain after the etching process. The positioning of the cut mask becomes difficult with the continuous scaling of the structures. Setting a variable pitch between structures has also been proposed but suffers from an insufficient lithography processing window resulting in, for example, line-width variations and line roughness. The term "pitch" refers to the distance between one structure or feature (e.g., a sidewall, a mandrel) and an adjacent structure or feature (e.g., a sidewall, a mandrel). The term "line-width" refers to the width of a structure or feature (e.g., a sidewall, a mandrel).

Illustrative embodiments of the invention advantageously provide for cutting unwanted or dummy structures (e.g., mandrels) without the use of a cut mask. FIGS. 2A through 9 depict one or more illustrative embodiments of a self-cut SIT process. The term "self-cut" refers to the absence of the use of a conventional cut mask to remove mandrels in the SIT process. Instead, the unwanted structure is cut without the need of lithography steps as will be further explained in illustrative detail below.

Figure 2A:
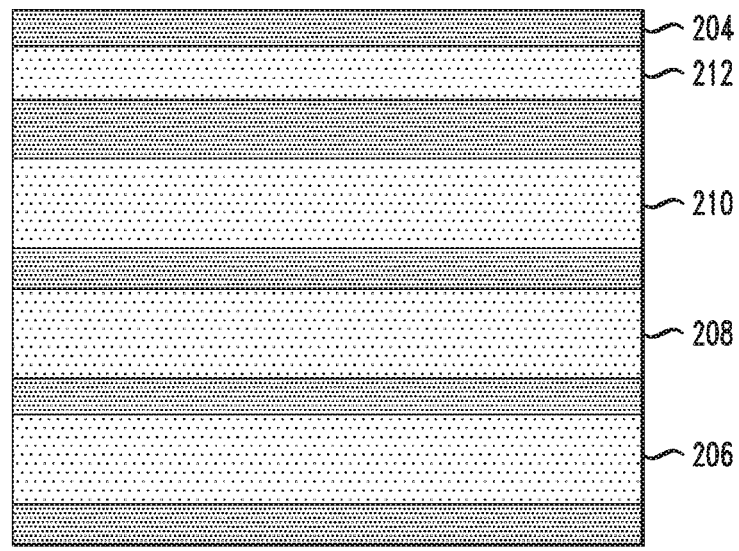
FIG. 2A is a top view illustrating a device with a plurality of mandrels formed on a hard mask over a silicon substrate in an embodiment of the invention.
Figure 2B:
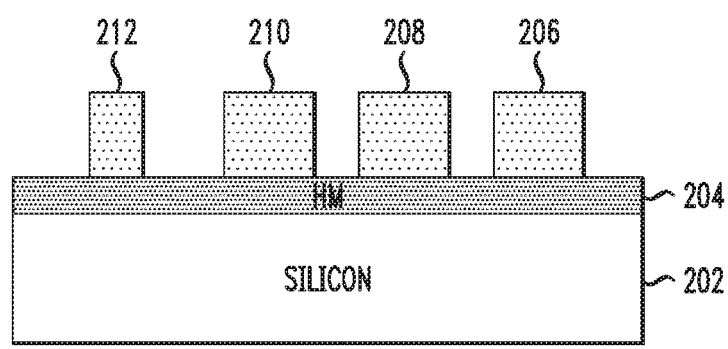
FIG. 2B is a cross sectional view illustrating the device of FIG. 2A.

FIGS. 2A and 2B illustrate, respectively, a top view and a cross sectional view of silicon substrate 202 with mandrels 206, 208, 210 and 212 formed over hard mask 204. Mandrels 206, 208, 210 and 212 are formed having a given common pitch from each mandrel to its adjacent mandrel. While the pitch may be measured from the center of a given mandrel to the center of an adjacent mandrel, alternative methods including measuring the pitch from any given point on a given mandrel to the corresponding point on an adjacent mandrel may be used. The mandrels are further formed to have variable critical dimensions (CD) or widths. In this embodiment, as shown in FIGS. 2A and 2B, mandrels 206, 208 and 210 have a large width relative to the width of mandrel 212. In an illustrative embodiment, the mandrel pitch may be about 40 nm, the CD of mandrel 212 may be about 12 nm, and the CD of mandrels 206, 208 and 210 may be about 26 nm.

As mentioned above, FIG. 2B illustrates a cross sectional view of the structure of FIG. 2A. The mandrels, placed at a given pitch to each other, and having a variable CD, form variable spaces between adjacent mandrels. For example, the spacing between mandrels 206 and 208 and the spacing between mandrels 208 and 210 are relatively narrow when compared to the spacing between mandrels 210 and 212. Assume the pitch of each mandrel to its adjacent mandrel is 40 nm, the CD of mandrels 206, 208 and 210 is 26 nm, and the CD of mandrel 212 is 12 nm. Therefore, the space between mandrel 206 and mandrel 208, and the space between mandrel 208 and 210 is 14 nm as shown in equations 1 and 2 below:

$$\text{spacing}=\text{pitch}-1/2\ CD(206/210)-1/2\ CD(208) \quad (1)$$

$$\text{spacing}=40\ nm-1/2*26\ nm-1/2*26\ nm=14\ nm \quad (2)$$

In the given example, if the pitch from mandrel 210 to mandrel 212 is 40 nm, and the CD of mandrel 210 is 12 nm, the space between mandrel 210 and mandrel 212 is 21 nm as shown in equations 3 and 4 below:

$$\text{spacing}=\text{pitch}-1/2\ CD(210)-1/2\ CD(212) \quad (3)$$

$$\text{spacing}=40\ nm-1/2*26\ nm-1/2*12\ nm=21\ nm \quad (4)$$

It will be shown in the following descriptions that the spacing between mandrels is important to the self-cut SIT process.

Figure 3:
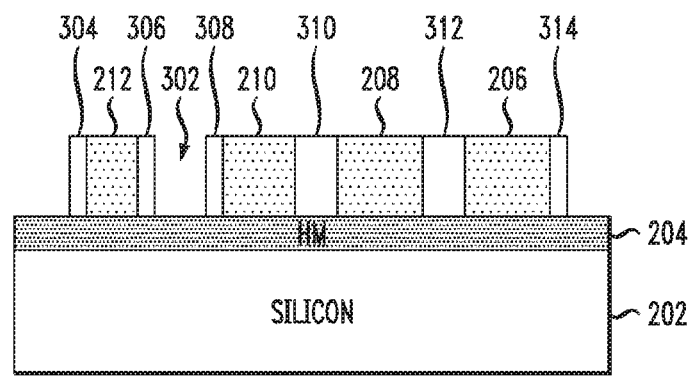
FIG. 3 is a cross sectional view illustrating the device of FIG. 2B after depositing an oxide layer and etching using a sidewall image transfer process.

As shown in FIG. 3, the wafer/device has been processed by depositing a dielectric layer over the mandrels and exposed hard mask and then etching the dielectric layer using a SIT process. After etching, a thin structure of the dielectric layer remains on the sidewalls of each of the mandrels. In the illustrative example, the sidewalls formed by the remaining dielectric layer may each have a thickness of about 8 nm. These sidewalls are shown in FIG. 3 as sidewalls 304, 306, 308, and 314. Since the space between mandrels 206 and 208, and the space between mandrels 208 and 210, is less than twice the thickness of a sidewall formed by the SIT process, the dielectric structures 310 and 312 remain intact. Additionally, since the space between mandrels 210 and 212 is greater than two times the thickness of a sidewall formed by the SIT process, space 302 is formed between sidewalls 306 and 308.

Figure 4:
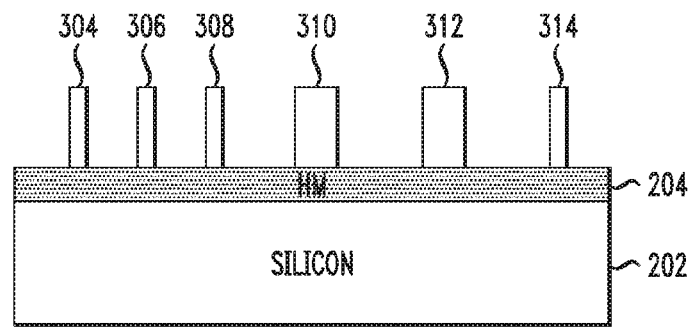
FIG. 4 is a cross sectional view illustrating the device of FIG. 3 after removal of the mandrels.

As shown in FIG. 4, mandrels 206, 208, 210 and 212 of FIG. 3 are removed. Removal of the mandrels can be achieved by, for example, using conventional etch methods such as an isotropic wet etch process using potassium hydroxide (KOH) or an anisotropic chlorine-based reactive-ion etching (RIE). The removal of the mandrels leaves the narrow sidewall structures 304, 306, 308 and 314, and wider structures 312 and 314 remaining on the hard mask 204.

Figure 5:
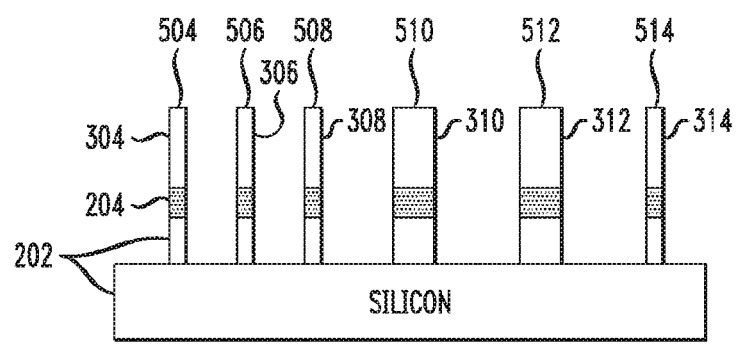
FIG. 5 is a cross sectional view illustrating the device of FIG. 4 after etching into the pattern of sidewalls leaving narrow and wide stacked layers.

The structure of FIG. 4 is further etched using, for example, chlorine-based RIE, to form narrow stacked layers 504, 506, 508 and 514, and wider stacked layers 510 and 512 as shown in FIG. 5. The etching process removes exposed hard mask 204, and a finite depth of the silicon substrate 202 below the exposed hard mask. The remaining stacked layer structures shown in FIG. 5 comprise portions of the silicon substrate 202, hard mask 204 and remaining dielectric layer formed after removal of the mandrels as shown in FIG. 4.

Figure 6:
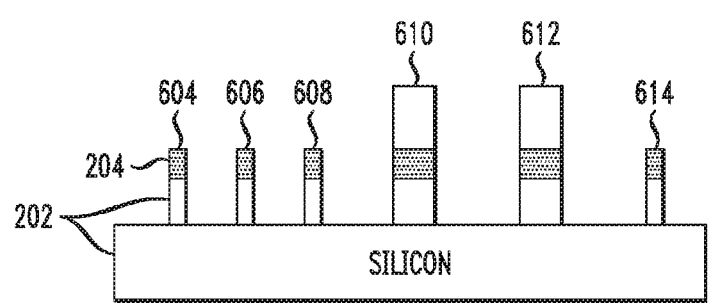
FIG. 6 is a cross sectional view illustrating the device of FIG. 5 after removal of sidewalls on the narrow stacked layers.

As shown in FIG. 6, the stacked layers are further etched to remove the top oxide layers 304, 306, 308 and 314, as shown in FIG. 4, from the narrower stacked layers 504, 506, 508 and 514 shown in FIG. 5, while removing a portion of the top oxide layers 310 and 312 from the wider stacked layers 510 and 512. The etching process removes the top oxide layers 304, 306, 308 and 314 from the narrow stacked layers faster than it removes the top oxide layers 310 and 312 from the wider stacked layers due to erosion, thereby leaving a remaining portion of the top oxide layers from the wider stacked layers. Accordingly, the remaining structure leaves the wider stacked layers 610 and 612 at a level above the silicon substrate higher than the level of the narrower stacked layers 604, 606, 608 and 614.

Figure 7:
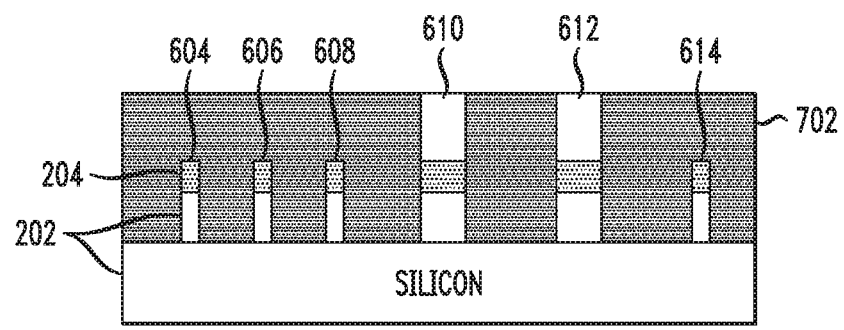
FIG. 7 is a cross sectional view illustrating the device of FIG. 6 after planarizing with a resist or dielectric.
Figure 8:
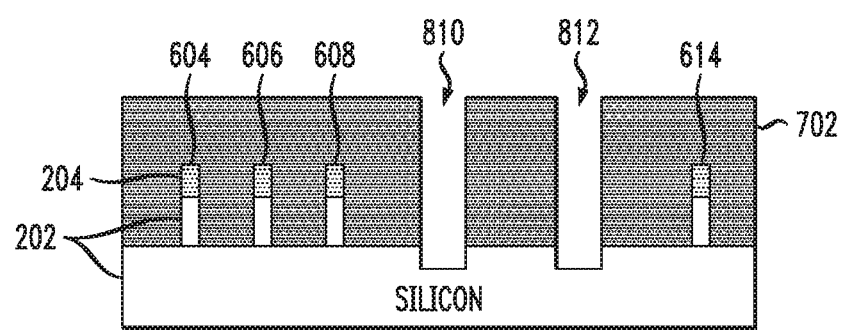
FIG. 8 is a cross sectional view illustrating the device of FIG. 7 after etching and removal of wide stacked layers.

As shown in FIG. 7, a resist or dielectric layer 702 is deposited and planarized to be coplanar with the top surface of the remaining wider stacked layers 610 and 612. The resist or dielectric layer 702 completely encloses the remaining narrow stacked layers 604, 606, 608 and 614. The process continues as shown in FIG. 8, wherein the wider stacked layers 610 and 612 are completely removed by an etching process leaving spaces 810 and 812. The etching process only etches the wider stacked layers since there top surfaces are exposed in the planarized pattern.

Figure 9:
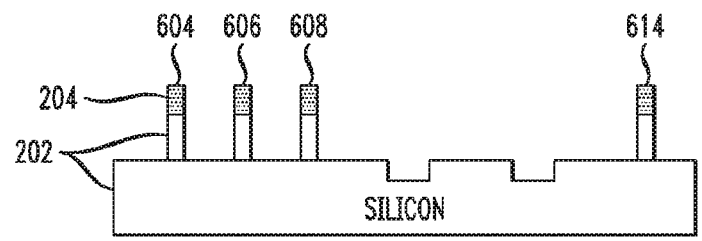
FIG. 9 is a cross sectional view illustrating the device of FIG. 8 after removal of the resist or dielectric of FIG. 7.

The resist or dielectric 702 is then removed leaving narrow structures 604, 606, 608 and 614 as shown in FIG. 9. FIG. 9 may represent a FinFET with separation between a three-fin device (including narrow structures 604, 606, 608 being the three fins) and a single fin device (including narrow structure 614 being the single fin).

Figure 10:
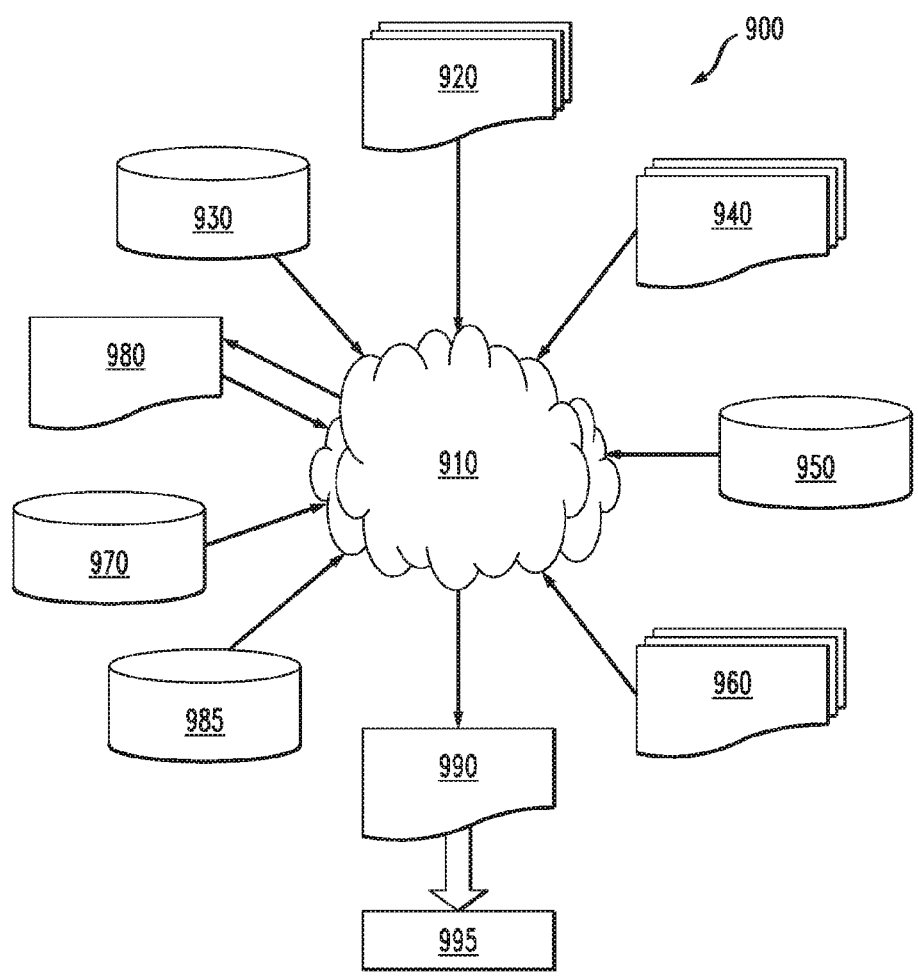
FIG. 10 is a flow diagram of a design process used in semiconductor design, manufacture, and/or test in an embodiment of the invention.

FIG. 10 shows a block diagram of an exemplary design flow 900 used for example, in semiconductor IC (integrated circuit) logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 2A-9. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g., e-beam writers), computers or equipment for simulating design structures, any apparatus used in the manufacturing or test process, or any machines for programming functionally equivalent representations of the design structures into any medium (e.g., a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 10 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 2A-9. As such, design structure 920 may comprise files or other data structures including human and/or machine-readable source code, compiled structures, and computer-executable code structures that, when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 2A-9 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nanometer (nm), 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990. Design structure 990 resides on a storage medium or programmable gate array in a data format used for the exchange of data of mechanical devices and structures (e.g., information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 2A-9. In one embodiment, design structure 990 may comprise a compiled, executable HDL simulation model that functionally simulates the devices shown in FIGS. 2A-9.

Design structure 990 may also employ a data format used for the exchange of layout data of integrated circuits and/or symbolic data format (e.g., information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 2A-9. Design structure 990 may then proceed to a stage 995 where, for example, design structure 990: proceeds to tape-out, is released to manufacturing, is released to a mask house, is sent to another design house, is sent back to the customer, etc.

Furthermore, it is to be appreciated that one or more illustrative embodiments described herein are used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either: (a) an intermediate product, such as a motherboard; or (b) an end product. The end product can be any product that includes integrated circuit chips, ranging from toys and other low-end applications to advanced computer products having a display, a keyboard or other input device, and a central processor.

Although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

What is claimed is:

1. A method comprising:

forming a hard mask on a silicon substrate;

forming a plurality of mandrels on the hard mask, and depositing a dielectric layer over the plurality of mandrels and the hard mask;

wherein said plurality of mandrels are spaced apart at a given pitch, wherein at least one of the plurality of mandrels is formed having a first width, and at least another one of the plurality of mandrels is formed having a second width, wherein the first width is greater than the second width; and forming at least one structure by performing a sidewall image transfer process without using a cut mask, wherein forming the at least one structure by performing the sidewall image transfer process without using a cut mask comprises:

etching the dielectric layer to form sidewalls on the sides of each of the mandrels;

removing the plurality of mandrels to form a pattern of sidewalls;

etching the pattern of sidewalls to form a plurality of layered stacks each comprising a given sidewall, the hard mask and the silicon substrate, wherein the layered stacks comprise one or more first layered stacks having a first layered stack thickness and one or more second layered stacks having a second layered stack thickness, wherein the second layered stack thickness is greater than the first layered stack thickness, wherein the first layered stacks comprise first sidewalls having a first thickness, and wherein the second layered stacks comprise second sidewalls having a second thickness;

etching the first and second layered stacks to remove an entirety of the first sidewalls, wherein the etching leaves remaining second sidewalls from the second sidewalls;

depositing a dielectric layer, planarizing said dielectric layer to be coplanar to a top surface of the remaining second sidewalls, and etching to remove the second layered stacks; and removing the planarized dielectric layer to expose the at least one structure.

2. The method of claim 1, wherein a first space is formed between a first mandrel having the first width and an adjacent second mandrel having the first width.

3. The method of claim 2, wherein a second space is formed between a first mandrel having the first width and an adjacent second mandrel having the second width.

4. The method of claim 3, wherein a third space is formed between a first mandrel having the second width and an adjacent second mandrel having the second width.

5. The method of claim 4, wherein the third space has a width greater than the width of the second space, and wherein the second space has a width greater than the width of the first space.

6. The method of claim 5, wherein the sidewalls formed in the first space merge together, substantially filling the first space, the merged sidewalls forming a sidewall having a second thickness.

7. The method of claim 5, wherein the sidewalls formed in the second space partially fill the second space, leaving a space between the sidewalls.

8. The method of claim 5, wherein the sidewalls formed in the third space partially fill the third space, leaving a space between the sidewalls.

* * * * *